United States Patent
Park et al.

(10) Patent No.: US 8,720,023 B2
(45) Date of Patent: May 13, 2014

(54) METHOD OF MANUFACTURING A MONOLITHIC DUPLEXER

(75) Inventors: Yun-kwon Park, Dongducheon-si (KR); In-sang Song, Seoul (KR); Seok-chul Yun, Yongin-sin (KR); Seog-woo Hong, Yongin-si (KR); Byeoung-ju Ha, Seongnam-si (KR); Dong-ha Shim, Seoul (KR); Hae-seok Park, Yongin-si (KR); Kuang-woo Nam, Yongin-si (KR); Duck-hwan Kim, Goyang-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1174 days.

(21) Appl. No.: 12/647,188

(22) Filed: Dec. 24, 2009

(65) Prior Publication Data

US 2010/0095497 A1   Apr. 22, 2010

Related U.S. Application Data

(62) Division of application No. 11/262,889, filed on Nov. 1, 2005, now Pat. No. 7,663,450.

(30) Foreign Application Priority Data

Nov. 23, 2004   (KR) .................. 10-2004-0096120

(51) Int. Cl.
*H03H 9/15* (2006.01)
*H03H 3/007* (2006.01)

(52) U.S. Cl.
USPC .......... 29/25.35; 29/602.1; 29/846; 29/25.41; 310/313 R

(58) Field of Classification Search
USPC .......... 29/25.35, 594, 25.41, 602.1, 846, 606; 438/25; 310/311, 313 R, 324; 333/129, 333/132, 133
See application file for complete search history.

(56) References Cited

U.S. PATENT DOCUMENTS

| 5,506,552 A | 4/1996 | Seki et al. |
| 6,262,637 B1 | 7/2001 | Bradley et al. |

(Continued)

FOREIGN PATENT DOCUMENTS

| EP | 0 949 756 A2 | 10/1999 |
| EP | 1058383 A2 | 12/2000 |

(Continued)

OTHER PUBLICATIONS

N. Shibagki et al., "Precise design technique for a SAW-resonator-coupled filter on 36° YX-LiTaO3 for use in a GSM SAW duplexer module for satisfying all GSM system specifications", Proceedings IEEE Ultrasonics Symposium, Nov. 3, 1996, pp. 19-24, vol. 1, Japan.

(Continued)

*Primary Examiner* — A. Dexter Tugbang
(74) *Attorney, Agent, or Firm* — Sughrue Mion, PLLC

(57) ABSTRACT

A method for fabricating subminiature, high-performance monolithic duplexer is disclosed. The method comprises depositing and patterning a lower electrode on an upper surface of an insulation layer on a substrate, so as to expose a first part of the insulation layer; depositing a piezoelectric layer on an upper surface of the exposed insulation layer and the lower electrode; depositing a metal on the upper part of the piezoelectric layer and patterning the metal to form a resonance part and a trimming inductor, wherein the lower electrode electrically couples the resonance part and the trimming inductor; fabricating air gap type FBARs (film bulk acoustic resonances) by forming a cavity by etching the substrate under the resonance part; and bonding a packaging substrate on the substrate, the packaging substrate having a phase shifting part which substantially prevents inflow of signal between the air gap type FBARs.

9 Claims, 8 Drawing Sheets

(56) References Cited

U.S. PATENT DOCUMENTS

| | | |
|---|---|---|
| 6,427,954 B1 | 8/2002 | Sundara et al. |
| 6,710,681 B2 * | 3/2004 | Figueredo et al. ........ 310/324 X |
| 6,713,314 B2 * | 3/2004 | Wong et al. .................. 438/25 |
| 6,768,396 B2 | 7/2004 | Klee et al. |
| 2003/0009863 A1 | 1/2003 | Figueredo et al. |
| 2003/0119219 A1 | 6/2003 | Farcy et al. |
| 2003/0186673 A1 | 10/2003 | Kimachi et al. |
| 2003/0205948 A1 | 11/2003 | Lin et al. |
| 2004/0029356 A1 | 2/2004 | Timme et al. |
| 2004/0032012 A1 | 2/2004 | Wong et al. |
| 2004/0056560 A1 * | 3/2004 | Wang et al. .................. 310/311 |
| 2004/0164367 A1 | 8/2004 | Park |
| 2004/0207485 A1 | 10/2004 | Kawachi et al. |
| 2004/0212452 A1 * | 10/2004 | Tsutsumi et al. ............. 333/133 |
| 2004/0257171 A1 | 12/2004 | Park et al. |
| 2006/0001123 A1 | 1/2006 | Heck et al. |
| 2006/0012021 A1 | 1/2006 | Larson, III et al. |
| 2006/0214745 A1 | 9/2006 | Park et al. |

FOREIGN PATENT DOCUMENTS

| | | | |
|---|---|---|---|
| EP | 1225695 A2 | 7/2002 | |
| EP | 1233511 A2 | 8/2002 | |
| EP | 1469599 A2 | 10/2004 | |
| EP | 1471635 A2 | 10/2004 | |
| EP | 1 526 640 A1 | 4/2005 | |
| JP | 57028223 A * | 2/1982 | ................. 29/25.35 |
| JP | 2-125475 A | 5/1990 | |
| JP | 06-350307 | 12/1994 | |
| JP | 08-191230 | 7/1996 | |
| JP | 08-321738 | 12/1996 | |
| JP | 9-270604 A | 10/1997 | |
| JP | 2001-24476 A | 1/2001 | |
| JP | 2001-68965 A | 3/2001 | |
| JP | 2001-127588 A | 5/2001 | |
| JP | 2003-298392 A | 10/2003 | |
| JP | 2003-318695 A | 11/2003 | |
| JP | 2004-17171 A | 1/2004 | |
| JP | 2004-48639 A | 2/2004 | |
| JP | 2004-112277 A | 4/2004 | |
| JP | 2004-523949 A | 8/2004 | |
| JP | 2004-254325 A | 9/2004 | |
| JP | 2004-320784 A | 11/2004 | |
| WO | 02058233 A1 | 7/2002 | |
| WO | 2004009863 A1 | 1/2003 | |
| WO | 03/079439 A2 | 9/2003 | |

OTHER PUBLICATIONS

Anne Jourdain et al., "Wafer-scale 0-level packaging of (RF-) MEMS devices using BCB", IEEE Symposium on Design, Test, Integration and Packaging of MEMS/MOEMS, May 5-7, 2003, pp. 239-241, Belgium.

John D. Larson III et al., "A BAW antenna duplexer for the 1900 MHz PCS band", IEEE Ultrasonics Symposium, Oct. 17, 1999, pp. 887-890, USA.

K.M. Lakin, "Thin film resonator technology", IEEE Int. Frequency Control Symposium & PDA Exhibition Jointly with the 17$^{th}$ European Frequency and Time Forum, May 4-8, 2003, pp. 765-778, USA.

M. Handtmann et al., "Bulk acoustic wave filters for GPS with extreme stopband attenuation", IEEE Int. Microwave Symposium Digest, Jun. 2004, pp. 371-374, Germany.

Kok-Wan Tay et al., "Influence of Piezoelectric Film and Electrode Materials on Film Bulk Acoustic-Wave Resonator Characteristics", Japanese Journal of Applied Physics, Mar. 2004, pp. 1122-1126, vol. 43, No. 3, Taiwan.

K. Ulrich et al., "Getting aggressive with passive devices", IEEE Circuits and Devices Magazine, Sep. 5, 2000, pp. 17-25, vol. 16, No. 5.

S. Marksteiner et al., "A miniature BAW duplexer using flip-chip on LTCC", IEEE Ultrasonics Symposium, Oct. 2003, pp. 1794-1797, vol. 1.

P. Pieters et al., "Integration of passive components in thin film multilayer MCM-D technology for wireless front-end applications", Asia-Pacific Microwave Conference, Dec. 2000, pp. 221-224, Belgium.

B. Arbuckle et al., "Processing Technology for Integrated Passive Devices", Solid State Technology, Nov. 2000, pp. 84-86, 88, 90, vol. 43, No. 11, USA.

Jae Y. Park et al., "Micromachined FBAR RF Filters for Advanced Handset Applications", 12$^{th}$ International Conference on Tranducers, Jun. 9, 2003, pp. 911-914, vol. 1, Korea.

Joel Rosenbaum et al., "Design and fabrication of two-pole monolithic bulk acoustic filters", Digest Microwave and Millimeter-Wave Monolithic Circuits Symposium, May 7-8, 1990, pp. 63-66, USA.

C.W. Seabury et al.; "Thin Film ZnO Based Bulk Acoustic Mode Filers"; 1997 IEEE Microwave Symposium Digest, Jun. 8-13, 1997, vol. 1, pp. 181-184.

* cited by examiner

METHOD OF MANUFACTURING A MONOLITHIC DUPLEXER

CROSS-REFERENCE TO RELATED APPLICATIONS

This application is a Divisional of U.S. application Ser. No. 11/262,889, filed Nov. 1, 2005, which issued as U.S. Pat. No. 7,663,450, claiming priority from Korean Patent Application No. 10-2004-0096120, filed on Nov. 23, 2004, the entire content of which is incorporated herein by reference.

BACKGROUND OF THE INVENTION

1. Technical Field

The present invention relates to a monolithic duplexer, and more particularly to a monolithic duplexer that includes transmitting/receiving part filters, each including a resonator and a trimming inductor formed on a substrate and a phase shifter, which is formed on a packaging substrate, for preventing signal interference between the transmitting/receiving part filters, and a fabricating method thereof.

2. Related Art

A duplexer is a related art element that compositely uses a filter, and serves to efficiently share an antenna by properly branching transmitted/received signals through the same antenna in an FDD (Frequency Division Duplex) type communication system.

The duplexer includes a transmitting-end filter and a receiving-end filter. The transmitting-end filter is a band pass filter that passes only a frequency subject to transmission, and the receiving-end filter is a band pass filter that passes only a frequency subject to reception. By passing specified frequency band signals through the respective filters, one antenna can efficiently be shared. This duplexer is used in various kinds of RF appliances that perform wireless communication.

Particularly, the related art mobile phone has been improved in function and size. More specifically, a subminiature, high-sensitivity and multifunction mobile phone has recently been developed. Consequently, it is also necessary to fabricate a small-sized, light-weight filter or duplexer that is used in the mobile phone. Accordingly, an FBAR (Film Bulk Acoustic Resonator) manufactured using an MEMS (Micro-Electro-Mechanical Systems) technology has recently been used for filter or duplex fabrication. The FBAR can be mass-produced with a minimal cost and size. Additionally, the FBAR has a high quality factor Q that is the main characteristic of the filter, and can be used in a micro-frequency band as well as in PCS (Personal Communication System) and DCS (Digital Cordless System) bands.

Meanwhile, since the frequencies of signals transmitted/received through the transmitting-end filter and the receiving-end filter are slightly different, they react sensitively to each other to cause signal interference between them. To solve this, the duplexer further includes a phase shifter for isolating the transmitting/receiving part filters from each other. The phase shifter is typically implemented by a combination of a capacitor and an inductor that generates a frequency phase difference between the transmitted signal and the received signal of 90 degrees to prevent the mutual influence exerted between them.

FIG. 1 is a vertical sectional view illustrating the structure of a duplexer fabricated according to a related art method. The related art duplexer includes a printed circuit board (PCB) 10, a phase shifter 20, a transmitting-end filter 30 and a receiving-end filter 40. In this case, the phase shifter 20, transmitting-end filter 30 and receiving-end filter 40 are formed as separate elements, and are bonded on the PCB 10. The connection among the transmitting/receiving part filters 30 and 40 and the phase shifter 20 is made by a wire bonding method. According to the duplexer fabricated by the method illustrated in FIG. 1, respective internal elements are separately formed, packaged and then combined into one. Accordingly, the whole fabricating process is complicated, and the size of the finally fabricated duplexer becomes larger. Additionally, since the respective elements are connected together by the wire bonding method, signal loss may occur due to parasitic components produced in the wire parts. Consequently, the duplexer illustrated in FIG. 1 has at least the drawback in that it is disadvantageous to use the duplexer in a small-sized, high-performance appliance such as a mobile phone.

SUMMARY OF THE INVENTION

An aspect of the present invention is to provide a monolithic duplexer fabricated with a small size by making filters on a single substrate, making a phase shifter for preventing signal interference between the filters on a packaging substrate and then packaging them, and a fabricating method thereof.

Another aspect of the present invention is to provide a monolithic duplexer fabricated with a small size by using one trimming inductor inside a filter, and a fabricating method thereof.

The foregoing and other objects and advantages are substantially realized by providing a monolithic duplexer, according to the present invention, which comprises a substrate, a transmitting-end filter formed in a first area on an upper surface of the substrate, a receiving-end filter formed in a second area on the upper surface of the substrate, a packaging substrate, bonded on a specified area on the upper surface of the substrate, for packaging the transmitting-end filter and the receiving-end filter in a sealed state, and a phase shifter, formed on one surface of the packaging substrate and connected to the transmitting-end filter and the receiving-end filter, respectively, for intercepting a signal inflow between the transmitting-end filter and the receiving-end filter.

The packaging substrate has a first cavity formed by etching a specified area on a lower surface of the packaging substrate, and is bonded on the upper surface of the substrate so that the transmitting-end filter and the receiving-end filter are located inside the first cavity.

The phase shifter may be formed on a lower surface of the packaging substrate inside the first cavity.

In another aspect of the present invention, the packaging substrate may further comprise at least one connection electrode that penetrates upper and lower parts of the packaging substrate. In this case, the phase shifter may be formed on the upper surface of the packaging substrate, and connected to the transmitting-end filter and the receiving-end filter through the at least one connection electrode.

At least one of the transmitting-end filter and the receiving-end filter may comprise a plurality of serial resonators connected in series on the upper surface of the substrate, at least one parallel resonator formed on the upper surface of the substrate and connected to at least one node formed among the plurality of serial resonators, and at least one trimming inductor formed on the upper surface of the substrate and connected to the at least one parallel resonator.

At least one of the transmitting-end filter and the receiving-end filter may comprise a plurality of serial resonators connected in series on the upper surface of the substrate, a first parallel resonator formed on the upper surface of the substrate and connected to a first node formed on one side of one resonator among the plurality of resonators, a second parallel resonator formed on the upper surface of the substrate and connected to a second node formed on one side of one resonator among the plurality of resonators, and a trimming inductor which is formed on the upper surface of the substrate and one end of which is commonly connected to the first and second parallel resonators.

Meanwhile, at least one of the plurality of serial resonators, the first parallel resonator and the second parallel resonator may comprise a second cavity formed on a specified area on the upper surface of the substrate, and a resonance part formed in a position that is apart for a distance from a bottom surface inside the second cavity as a structure in which a first electrode, a piezoelectric layer and a second electrode are deposited in order.

The trimming inductor may be formed by patterning the second electrode on an upper surface of the piezoelectric layer in the form of a specified coil.

The phase shifter may be an LC parallel circuit implemented by depositing an insulation layer and a metal layer in order, and make frequencies of signals inputted to the transmitting-end filter and the receiving-end filter have a phase difference of 90 degrees.

The phase shifter may comprise a first insulation layer deposited on one surface of the packaging substrate, a first metal layer deposited on a specified area of the first insulation layer, a second insulation layer deposited on a remaining area except for a part of the first metal layer, a second metal layer deposited on an area of the second insulation layer deposited on an upper part of the first metal layer, a third metal layer deposited on an area of the second insulation layer deposited on an upper part of the first insulation layer, an organic insulation layer deposited on an upper part of the third metal layer, and a fourth metal layer deposited on an upper part of the organic insulation layer in the form of a coil.

BRIEF DESCRIPTION OF THE DRAWINGS

The above and/or other aspects of the present invention will be more apparent by describing exemplary embodiments of the present invention with reference to the accompanying drawings, in which.

DETAILED DESCRIPTION OF THE EXEMPLARY EMBODIMENTS OF THE INVENTION

Figure 1:
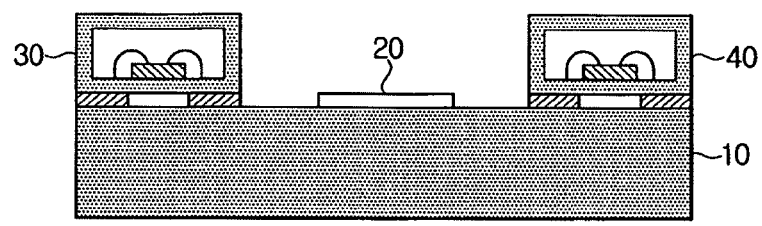
FIG. 1 is a vertical sectional view illustrating the structure of a duplexer fabricated according to the related art method.

Exemplary embodiments of the present invention will be described in greater detail with reference to the accompanying drawings.

In the following description, same drawing reference numerals are used for the same elements even in different drawings. The matters defined in the description such as a detailed construction and elements are provided to assist in a comprehensive understanding of the invention. Thus, it is apparent that the present invention can be carried out with or without those matters. Also, related art functions or constructions are not described in detail for the sake of clarity and brevity.

Figure 2:
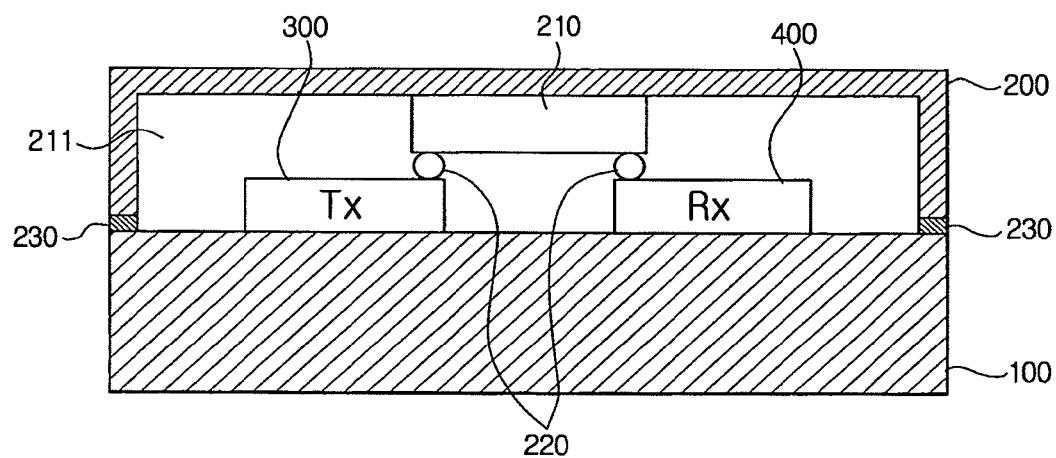
FIG. 2 is a vertical sectional view illustrating the structure of a monolithic duplexer according to an exemplary embodiment of the present invention.

FIG. 2 is a vertical sectional view illustrating the structure of a monolithic duplexer according to an exemplary embodiment of the present invention. The monolithic duplexer according to the exemplary embodiment includes a substrate 100, a packaging substrate 200, a phase shifter 210, a transmitting-end filter 300 and a receiving-end filter 400.

The substrate 100 is a typical silicon substrate. At first and second areas on an upper surface of the substrate 100, the transmitting-end filter 300 and the receiving-end filter 400 are respectively formed. As described above, the transmitting-end filter 300 and the receiving-end filter 400 are band pass filters that pass only signals within a frequency band. In this case, a plurality of FBARs (Film Bulk Acoustic Resonators) may be connected (e.g., coupled) in series and in parallel as filters to adjust the frequency pass band. Meanwhile, the transmitting-end filter 300 and the receiving-end filter 400 may include trimming inductors (not illustrated) to improve the frequency characteristic by attenuating a signal in a band substantially higher than the frequency pass band of the filters. Connection and sectional structures of the transmitting-end filter 300 and the receiving-end filter 400 are explained below.

The packaging substrate 200 is bonded on an area (i.e., a third area) on the upper surface of the substrate 100 to seal the transmitting-end filter 300 and the receiving-end filter 400. A first cavity 211 may be formed by etching the surface of the packaging substrate 200 that is bonded on the upper surface of the substrate 100. Accordingly, the packaging substrate 200 is bonded on the substrate 100 so that the transmitting-end filter 300 and the receiving-end filter 400 are positioned inside the first cavity 211. For this, a bonding layer 230 is deposited on the sides of the packaging substrate 200 and the substrate 100.

Meanwhile, the phase shifter 210 is formed on the part of the packaging substrate 200 and connected to the transmitting-end filter 300 and the receiving-end filter 400 through a connection part 220. The phase shifter 210 may be implemented by an LC parallel circuit in which a capacitor and a coil are deposited sequentially. This LC parallel circuit formed by depositing the capacitor and the coil sequentially makes the signals passing through the transmitting-end filter 300 and the receiving-end filter 400 have a phase difference of 90 degrees. That is, if the transmitting-end signal refers to sin $\Theta$, the receiving-end signal becomes cos $\Theta$ (i.e., sin $(90+\Theta)$= cos $(\Theta)$) that has the phase difference of 90 degrees. Since sin $\Theta$ cos $\Theta$=0, the transmitting-end signal and the receiving-end signal do not affect each other. Although FIG. 2 exemplifies the phase shifter 210 that is formed on the lower surface of the packaging substrate 200, the phase shifter 210 may be formed on the upper surface of the packaging substrate 200 according to another exemplary embodiment, which is explained below.

The connection part 220 may be formed using a conductive material. For example but not by way of limitation, the connection part 220 is formed by a bumping method, that is, by fabricating an external connection terminal (i.e., a conductive bump) in the form of a projection having a size of several tens to several hundreds of micrometers ($\mu$m) using gold, solder or other metals. Since this bumping type connection shortens the path of an electric line in comparison to the wire bonding type connection, electrical resistance and electrical noise can be substantially reduced to improve the electric performance of the duplexer.

Figure 3:
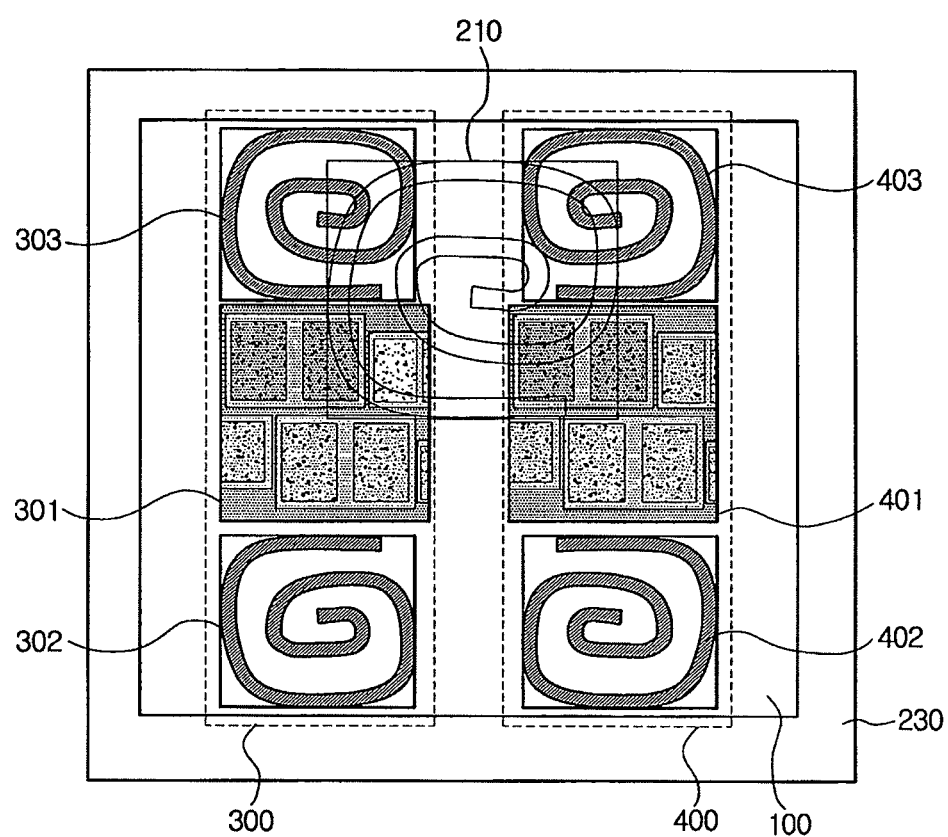
FIG. 3 is a horizontal sectional view illustrating the structure of the monolithic duplexer of FIG. 2.

FIG. 3 is a horizontal sectional view illustrating the structure of the monolithic duplexer of FIG. 2. On a specified area of the upper surface of the substrate 100 of the duplexer, the transmitting-end filter 300 and the receiving-end filter 400 are formed. The transmitting-end filter 300 and the receiving-end filter 400 include a plurality of FBARs 301 and 401 and trimming inductors 302, 303, 402 and 403. That is, the FBARs 301 and 401 and the trimming inductors 302, 303, 402 and 403 are formed on the single substrate 100 through the same process.

Accordingly, the area required for packaging the respective elements is reduced. Thus, the whole size of the duplexer can be reduced. Meanwhile, the packaging substrate 200 is bonded on the bonding layer 230 on the edge part of the substrate 100 to seal the transmitting-end filter 300 and the receiving-end filter 400. Accordingly, the phase shifter 210 formed on the side of the packaging substrate 200 is bonded on the filters 300 and 400, more specifically being positioned on upper sides of the filters 300 and 400. Consequently, the area occupied by the phase shifter 210 is reduced so as to further reduce the whole size of the duplexer.

Figure 4:
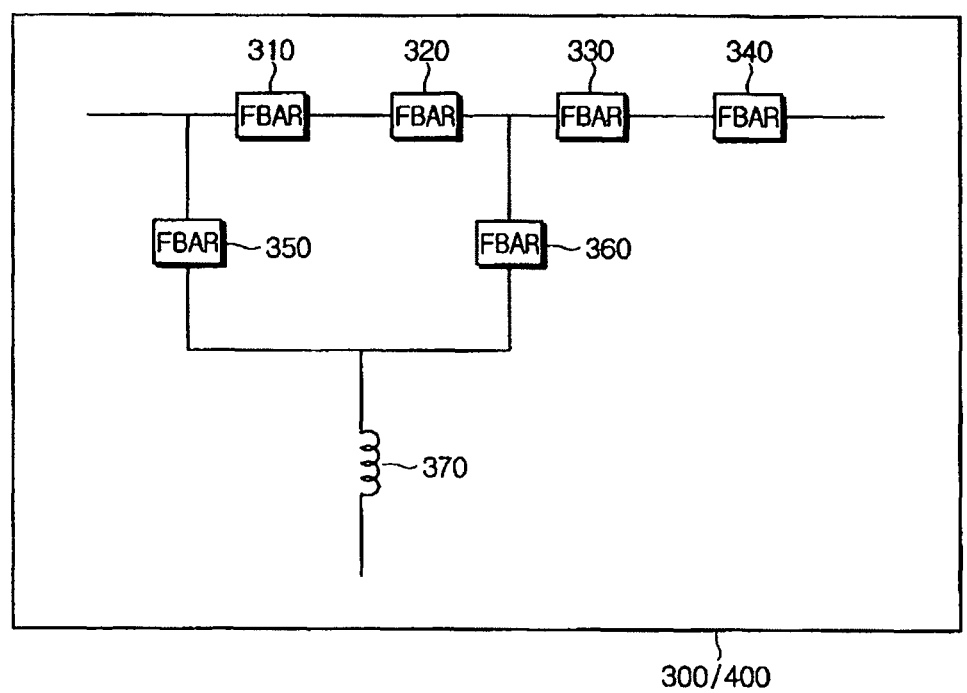
FIG. 4 is a view exemplifying the construction of a filter used in the monolithic duplexer of FIG. 2.

FIG. 4 is a view exemplifying the construction of the filter used in the monolithic duplexer of FIG. 2. At least one of the transmitting-end filter 300 and the receiving-end filter 400 used in the duplexer of FIG. 2 may have the construction as illustrated in FIG. 4. That is, the filter includes a plurality of FBARs (hereinafter referred to as serial resonators) 310 to 340 connected in series, a plurality of FBARs (hereinafter referred to as parallel resonators) 350 and 360 connected to a node formed on one side of the specified serial resonator, and a trimming inductor 370, one side of which is connected to the respective parallel resonators.

Referring to FIG. 4, the filter is designed such that the first parallel resonator 350 has a larger capacitance value than the first serial resonator 310, and the second parallel resonator 360 has a larger capacitance value than the second serial resonator 320. Accordingly, the first and second parallel resonators 350 and 360 can be connected with the inductor of relatively lower inductance. In other words, larger capacitance value can be obtained by fabricating the first and second parallel resonators 350 and 360 to have larger area than the first and second serial resonators 310 and 320.

The operation of the filters implemented by combining the serial resonators and the parallel resonators as illustrated in FIG. 4 will now be explained. It is assumed that the anti-resonance frequency and resonance frequency of the serial resonator is f1 and f2 and the anti-resonance frequency and resonance frequency of the parallel resonator is f3 and f4, respectively.

If the frequency characteristic of the serial resonator or parallel resonator is adjusted so that the anti-resonance frequency f3 of the parallel resonator coincides with the resonance frequency f2 of the serial resonator in this state, the filter serves as a band pass filter that passes only signals having a frequency band of f1 to f4. In this case, the resonance frequency of the band pass filter becomes f2 (=f3). Meanwhile, the trimming inductor 370 is commonly connected to the parallel resonators 350 and 360. In this case, the size of the filter is substantially reduced in comparison to the filter having a plurality of trimming inductors 370 connected to the parallel resonators 350 and 360, respectively.

Figure 5:
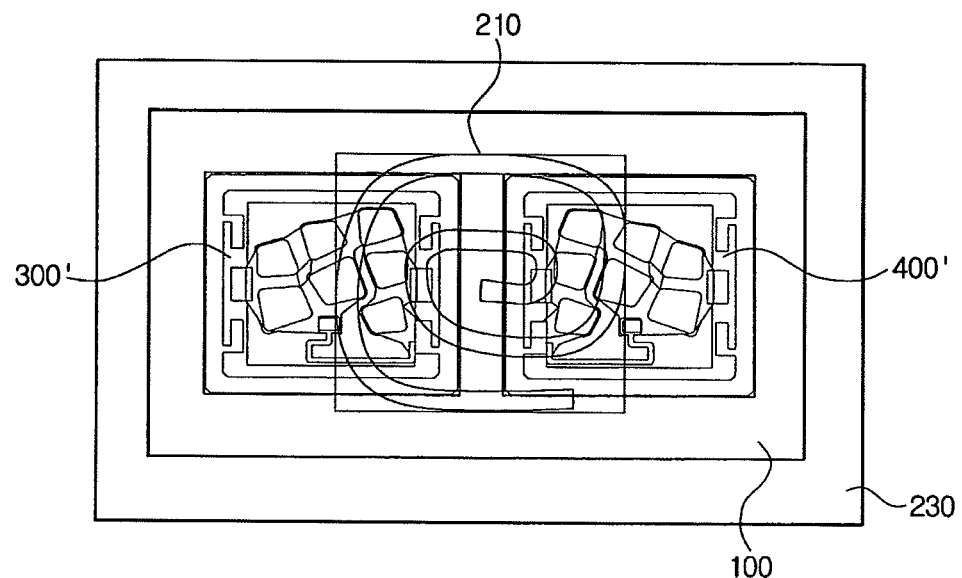
FIG. 5 is a horizontal sectional view illustrating the structure of the monolithic duplexer that uses the filter of FIG. 4.

FIG. 5 is a horizontal sectional view illustrating the structure of the monolithic duplexer that uses the filter of FIG. 4. Referring to FIG. 5, each of transmitting/receiving part filters 300' and 400' includes a plurality of serial resonators, a plurality of parallel resonators and a trimming inductor. In the same manner as in FIG. 3, the phase shifter 210 formed on the side of the packaging substrate 200 is connected to the respective filters 300' and 400' if the packaging substrate 200 is bonded on the bonding area 230 on the edge part of the substrate 100.

FIGS. 6A to 6E are vertical sectional views illustrating the process of fabricating the filter of FIG. 4. Since the filter illustrated in FIG. 4 includes a plurality of serial resonators 310 to 340, a plurality of parallel resonators 350 and 360 and a trimming inductor 370, the construction of the filter is illustrated in the vertical sectional view. Accordingly, the whole filter fabricating process will be explained with reference to FIGS. 6A to 6E, which illustrate only one parallel resonator 350 and a trimming inductor 370.

Figure 6A:
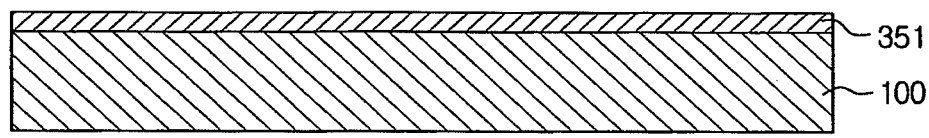
FIGS. 6A to 6E are vertical sectional views illustrating a process of fabricating the filter of FIG. 4.

First, an insulation layer 351 is deposited on the whole upper surface of the substrate 100 as shown in FIG. 6A. The insulation layer 351 is a part for electrically insulating the elements formed on the substrate 100 from the substrate 100. Silicon dioxide ($SiO_2$), aluminum oxide ($Al_2O_3$) or the like, may be used as an insulation material that forms the insulation layer 351. Meanwhile, an RF magnetron sputtering method, evaporation method, or the like may be used as a method for depositing the insulation layer 351 on the substrate 100.

Figure 6B:
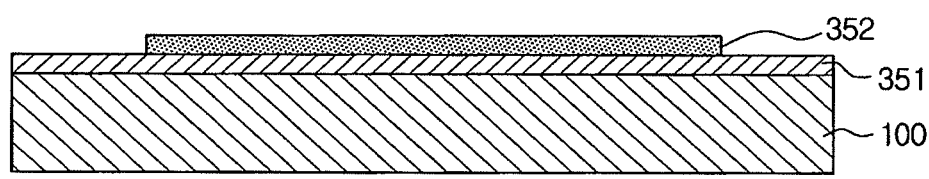

Then, as shown in FIG. 6B, a lower electrode 352 is deposited on the upper surface of the insulation layer 351 and patterned so that a specified part of the insulation layer 351 is exposed. The lower electrode 352 is formed using a conductive material such as a metal. For example but not by way of limitation, aluminum (Al), tungsten (W), gold (Au), platinum (Pt), nickel (Ni), titanium (Ti), chrome (Cr), palladium (Pd), or molybdenum (Mo) may be used as the conductive material.

Figure 6C:
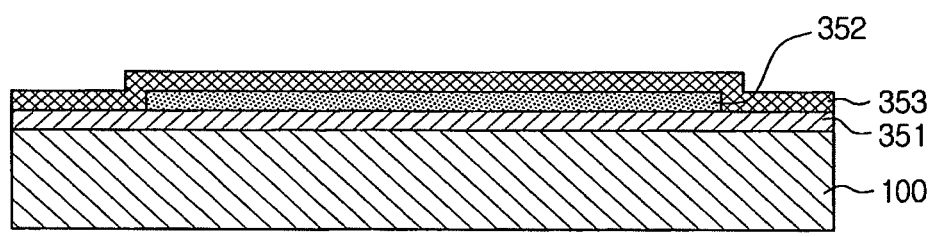

Then, as shown in FIG. 6C, a piezoelectric layer 353 is deposited over the whole upper surface of the exposed insulation layer 351 and the lower electrode 352. The piezoelectric layer 353 is a part having a piezoelectric effect that converts an electric energy into a mechanical energy in the form of an acoustic wave. For example but not by way of limitation, aluminum nitride (AlN), zinc oxide (ZnO), or the like may be used as a piezoelectric material that forms the piezoelectric layer 353.

Figure 6D:
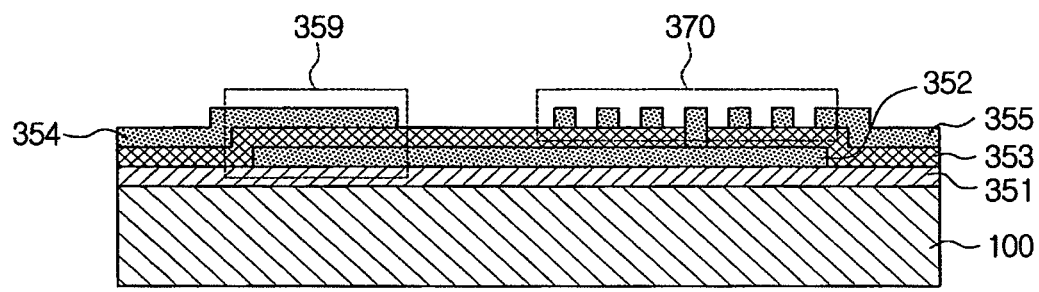

Then, as shown in FIG. 6D, an upper electrode 354 and a metal layer 355 are formed by depositing a metal on the upper part of the piezoelectric layer 353 and patterning the metal. The upper electrode 354 forms a resonance part 359 together with the lower electrode 352 and the piezoelectric layer 353. Meanwhile, on the piezoelectric layer 353 except for the part that forms the resonance part 359, a trimming inductor 370 may be formed by the metal layer that is patterned in the form of a circle or a quadrangle. In this case, the lower electrode 352 serves as a connection line for electrically connecting the resonance part 359 and the trimming inductor 370.

Figure 6E:
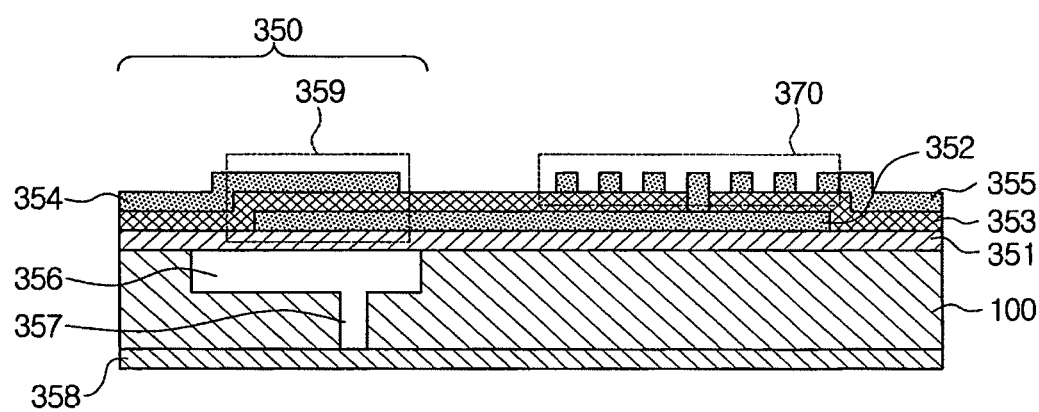

Thereafter, as shown in FIG. 6E, a second cavity 356 is formed by etching the substrate 100 under the resonance part 359, so that an air gap type FBAR (Film Bulk Acoustic Resonance) is fabricated. The fabricated air gap type FBAR acts as a parallel resonator 350. Meanwhile, in order to form a second cavity 356, a via-hole 357 is formed by etching a lower surface of the substrate 100. When the via-hole 357 is formed on the lower part of the substrate 100, a packaging substrate 358 may separately be bonded on the substrate 100 to substantially prevent an inflow of a foreign substance through the via-hole 357. In this case, a bonding method using an adhesive or a eutectic bonding method may be used as the bonding method. Meanwhile, the remaining serial resonators 310 to 340 and parallel resonator 360 may be formed through substantially the same process as above. That is, lower electrodes of the serial resonators 310 to 340 and the parallel resonators 350 and 360 are formed by depositing a metal layer on a substrate 100 and then patterning the metal layer in a specified form. Then the piezoelectric layer and the upper electrode are deposited on the respective resonators in order, so that the filter having the structure as illustrated in FIG. 4 is fabricated.

Meanwhile, FIGS. 7A to 7F are vertical sectional views illustrating the process of fabricating a phase shifter 210 to be used in the duplexer as illustrated in FIG. 2.

Figure 7A:
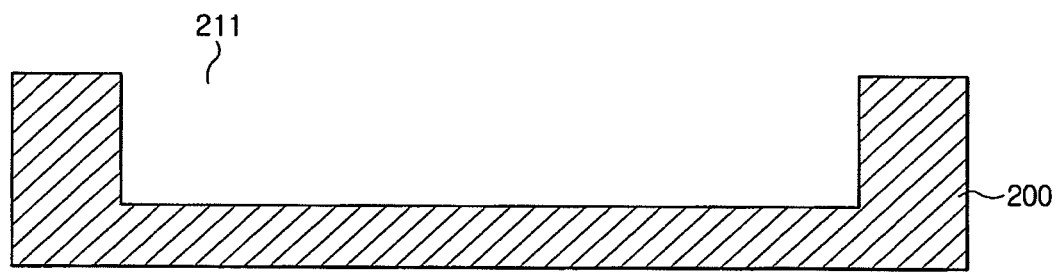
FIGS. 7A to 7F are vertical sectional views illustrating a process of fabricating a packaging substrate that includes a phase shifter.

First, a cavity 211 having a specified depth and area is formed by etching a part of the surface of a packaging substrate 200 as shown in FIG. 7A.

Figure 7B:
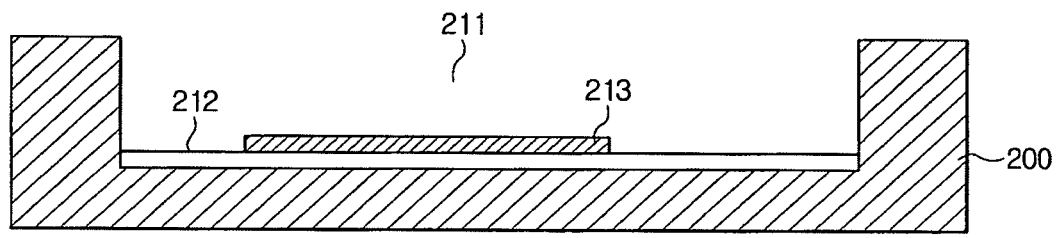

Then, as shown in FIG. 7B, a first insulation layer 212 is deposited on the surface of the packaging substrate 200 inside the cavity 211. Next, a first metal layer 213 is deposited on a specified area of the upper surface of the first insulation layer 212. The first metal layer 213 may be formed by electroplating gold (Au), chrome (Cr), or the like. Meanwhile, the first insulation layer 212 is for insulating the first metal layer 213 from the packaging substrate 200.

Figure 7C:
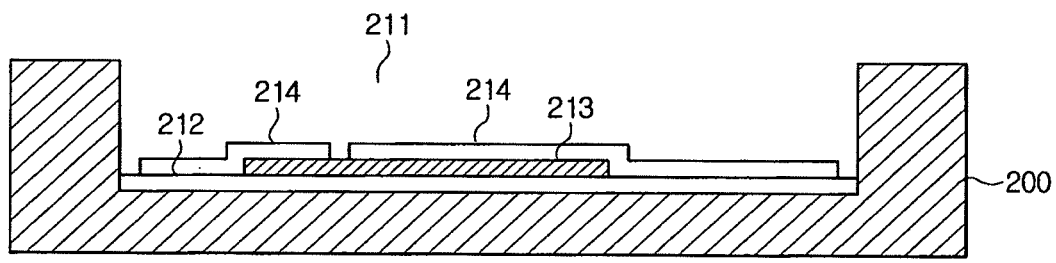

Then, as shown in FIG. 7C, a second insulation layer 214 is deposited on an internal area of the cavity 211. For example, but not by way of limitation, silicon nitride ($Si_3N_4$) may be used as a material of the second insulation layer 214. Specifically, the second insulation layer 214 is deposited on the upper surfaces of the first insulation layer 212 and the first metal layer 213 using a PECVD (Plasma Enhanced Chemical Vapor Deposition) method, and then a part of the second insulation layer 214 deposited on the upper part of the first metal layer 213 is removed using a reactive-ion etching (RIE) method and so on. Accordingly, a part of the first metal layer 213 is exposed and can be connected to an external terminal.

Figure 7D:
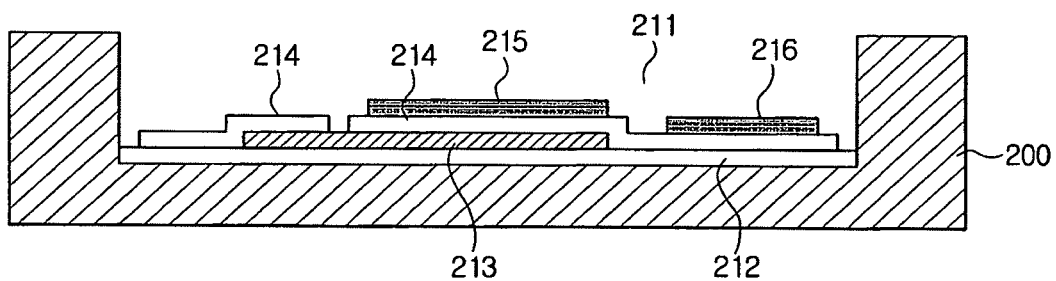

Then, as shown in FIG. 7D, a second metal layer 215 and a third metal layer 216 are deposited on a specified area of the surface of the second insulation layer 214. The second metal layer 215 deposited on the upper part of the second insulation layer 214 on the first metal layer 213 constitutes a capacitor together with the first metal layer 213 and the second insulation layer 214. That is, the first metal layer 213 and the second metal layer 215 constitute the electrodes of the capacitor, and the capacitance of the capacitor is varied according to the permittivity of the dielectric layer 214.

Figure 7E:
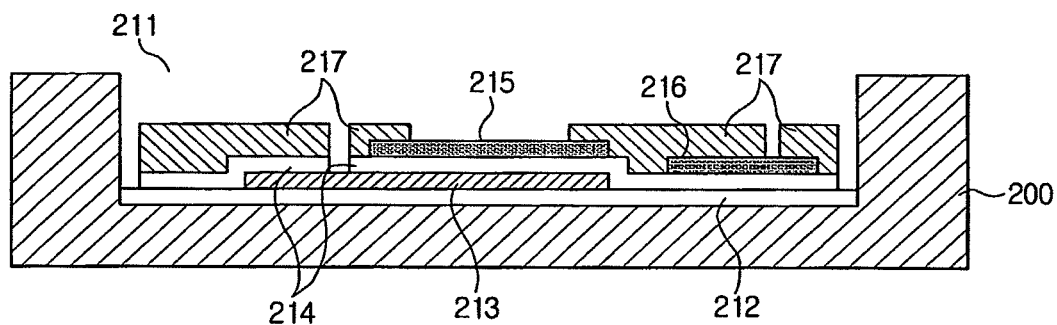

Then, as shown in FIG. 7E, an organic insulation layer 217 is formed by coating a material such as BCB (Benzo Cyclo Butane). Optionally, the organic insulation layer 217 is made of material having a low permittivity k with a thickness of about 8 μm. The organic insulation layer 217 serves as a protection layer for protecting the second and third metal layers 215 and 216 and the second insulation layer 214. Parts of the second and third metal layers 215 and 216 are exposed by etching a part of the coated organic insulation layer 217, so that a structure as illustrated in FIG. 7E is fabricated.

Figure 7F:
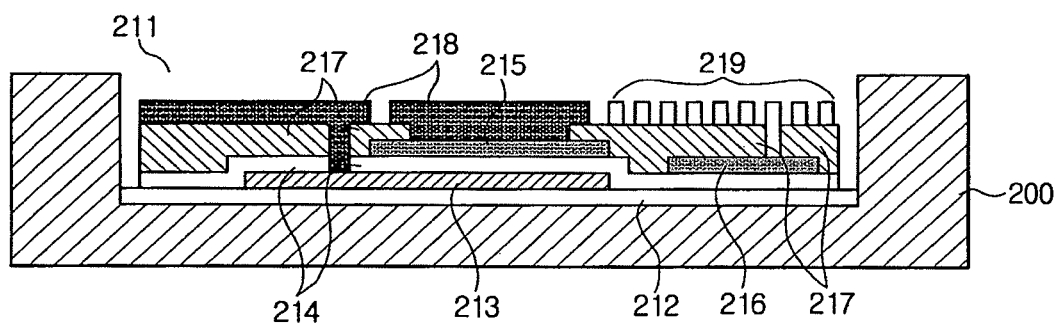

Then, as illustrated in FIG. 7F, a fourth metal layer 218 is deposited on the exposed first metal layer 212, the exposed second and third metal layers 215 and 216 and the area of the organic insulation layer 217. In this case, an inductor can be implemented by patterning the fourth metal layer 218 deposited on the organic insulation layer 217 in the form of a coil. One side of the inductor 219 is connected to the third metal layer 216 that is exposed. The third metal layer 216 is connected to the upper electrode of the capacitor (i.e., to the second metal layer 215), resulting in a capacitor-inductor parallel circuit.

Figure 8:
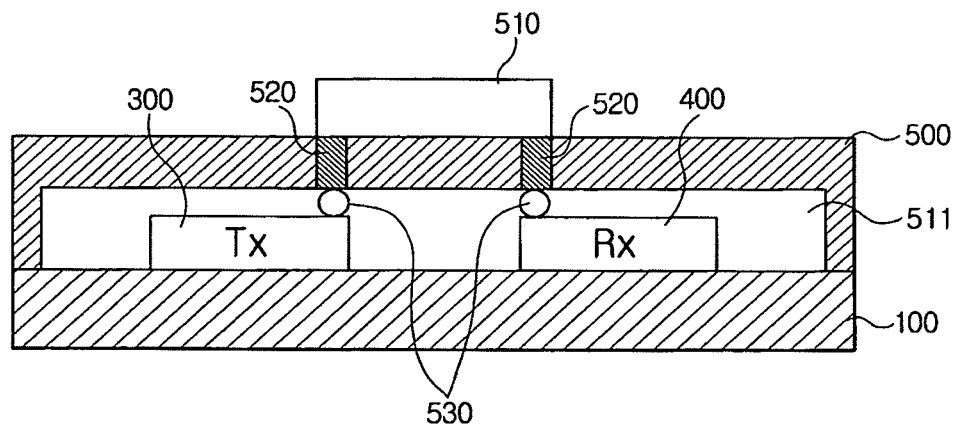
FIG. 8 is a vertical sectional view illustrating the structure of a monolithic duplexer according to another exemplary embodiment of the present invention.

FIG. 8 is a vertical sectional view illustrating the structure of the monolithic duplexer according to another exemplary embodiment. On the upper surface of the substrate 100, the transmitting-end filter 300 and the receiving-end filter 400 are formed. As described above, each of the transmitting-end filter 300 and the receiving-end filter 400 may include a plurality of serial resonators, a plurality of parallel resonators and at least one trimming inductor, which are integrated onto the substrate 100.

A packaging substrate 500 is bonded on the substrate 100 so that the transmitting-end filter 300 and the receiving-end filter 400 are positioned inside a cavity 511 that is formed on the lower surface of the packaging substrate 500. Meanwhile, a phase shifter 510 is formed on the upper surface of the packaging substrate 500, and is connected to the transmitting-end filter 300 and the receiving-end filter 400 through connection electrodes 520 that penetrate the packaging substrate 500 and connection parts 530. In this case, the phase shifter 510 may be formed to have the structure as illustrated in FIG. 7F, but is not limited thereto.

As described above, according to the present invention, a subminiature duplexer can be fabricated by forming a transmitting-end filter and a receiving-end filter on a single substrate and forming a phase shifter that prevents interference between the filters on a packaging substrate. Also, since no wire bonding is used, signal loss can be substantially prevented. Additionally, by making the respective filter include the trimming inductor, the duplexer can further be miniaturized.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A method of fabricating a monolithic duplexer comprising:
    depositing an insulation layer on an upper surface of a substrate;
    depositing and patterning a lower electrode on an upper surface of the insulation layer, so as to expose a first part of the insulation layer;
    depositing a piezoelectric layer on an upper surface of the exposed insulation layer and the lower electrode;
    depositing a metal on the upper part of the piezoelectric layer and patterning the metal to form an upper electrode and a metal layer, wherein the upper electrode forms a resonance part together with the lower electrode and the piezoelectric layer, the metal layer forms a trimming inductor, and the lower electrode electrically couples the resonance part and the trimming inductor;
    fabricating air gap type FBARs (film bulk acoustic resonances) by forming a cavity by etching the substrate under the resonance part; and
    bonding a packaging substrate on the substrate, the packaging substrate having a phase shifting part which substantially prevents inflow of signal between the air gap type FBARs.

2. The method of claim 1, wherein the insulation layer comprises at least one of silicon dioxide ($SiO_2$) and aluminum oxide ($Al_2O_3$), and said insulation layer is deposited by one of RF magnetron sputtering and evaporation.

3. The method of claim 1, wherein the lower electrode is formed using a conductive material comprising at least one of aluminum (Al), tungsten (W), gold (Au), platinum (Pt), nickel (Ni), titanium (Ti), chrome (Cr), palladium (Pd), and molybdenum (Mo).

4. The method of claim 1, wherein the piezoelectric layer comprises at least one of aluminum nitride (AlN) and zinc oxide (ZnO).

5. The method of claim 1, further comprising forming the trimming inductor on a part of the piezoelectric layer not including the resonance part.

6. The method of claim 5, wherein the trimming inductor is formed as the metal layer patterned as one of a circle and a quadrangle.

7. The method of claim 1, wherein the fabricated air gap type FBARs comprise a plurality of serial resonators coupled in series on the upper surface of the substrate, a first parallel resonator formed on the upper surface of the substrate and coupled to a first node formed on one side of one resonator among the plurality of resonators, a second parallel resonator formed on the upper surface of the substrate and coupled to a second node formed on one side of one resonator among the plurality of resonators.

8. The method of claim 1, wherein the cavity is formed by forming a via-hole by etching a lower surface of the substrate.

9. The method of claim 1, further comprising:
forming a cavity by etching one surface of the packaging substrate;
depositing a first insulation layer on a bottom of the cavity;
depositing a first metal layer on a predetermined area of the first insulation layer;
depositing a second insulation layer on the predetermined area of the first metal layer and on the first insulation layer;
fabricating a capacitor by depositing a second metal layer on a predetermined area of the second insulation layer which is deposited on the first metal layer;
depositing a third metal layer on a predetermined area of the second insulation layer which is not deposited on the first metal layer;
depositing an organic insulation layer on a predetermined area of the third metal layer; and
completing the packaging substrate integrated with a phase isolating part by fabricating the trimming inductor by depositing a fourth metal layer on the organic insulation layer in the form of a coil, the phase isolating part combining a capacitor and the trimming inductor.

* * * * *